Figure 1:
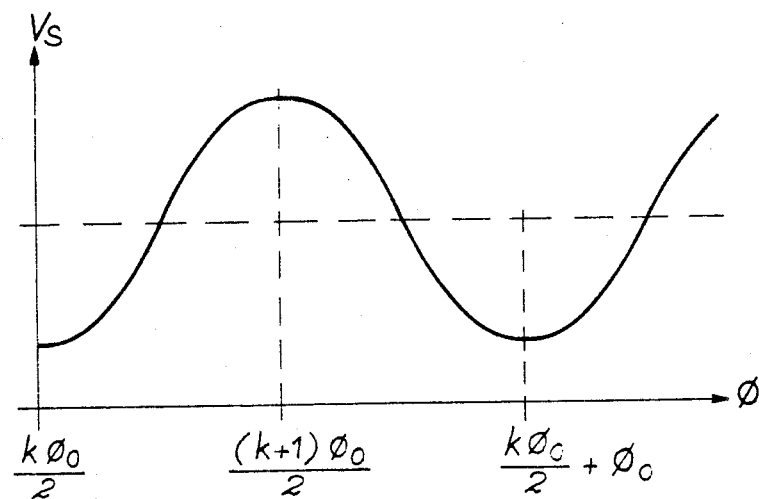

United States Patent [19]

Bloyet et al.

[11] Patent Number: 4,933,888

[45] Date of Patent: Jun. 12, 1990

[54] PROCESS FOR THE DIGITIZATION AND LINEARIZATION OF A TRANSDUCER WITH A QUASI-SINUSOIDAL PERIODIC CHARACTERISTIC AND CORRESPONDING APPARATUS

[75] Inventors: Daniel Bloyet, Thaon; Christian Dubuc, Evrecy; Denis Duret, Grenoble; Jacques Lepaisant, Herouville St. Clair; Didier Robbes, Verson; Khalid Benhida, Caen, all of France

[73] Assignee: Commissariat a l'Energie Atomique, Paris, France

[21] Appl. No.: 185,775

[22] Filed: Apr. 25, 1988

[30] Foreign Application Priority Data

Apr. 28, 1987 [FR] France .................. 87 06014

[51] Int. Cl.⁵ .......................................... G06F 15/353
[52] U.S. Cl. ................................... 364/573; 324/118; 324/132
[58] Field of Search ................ 364/573; 324/118, 132

[56] References Cited

U.S. PATENT DOCUMENTS

| | | | |
|---|---|---|---|
| 4,282,578 | 8/1981 | Payne et al. | 364/573 |
| 4,349,886 | 9/1982 | Ibar | 324/132 |
| 4,389,612 | 6/1983 | Simmonds et al. | 324/248 |
| 4,403,296 | 9/1983 | Prosky | 364/573 |
| 4,581,714 | 4/1986 | Reid | 364/573 |
| 4,766,559 | 8/1988 | Dobos et al. | 364/573 |
| 4,812,747 | 3/1989 | Gale et al. | 364/573 |

FOREIGN PATENT DOCUMENTS 8103710 12/1981 PCT Int'l Appl.

Primary Examiner—Parshotam S. Lall
Assistant Examiner—Christopher L. Makay

[57] ABSTRACT

Process for the digitization and linearization of a quasi-sinusoidal periodic characteristic transducer and the corresponding apparatus.

The process consist of measuring a variation ($\Delta\phi_x$) of a signal ($\phi_x$) received by the transducer in accordance with the following operations:

superimposing on the signal to be measured a first auxiliary periodic signal ($\phi_I$) of frequency $F_I$ higher than the highest frequency of the range of the signal to be measured and of amplitude substantially equal to $\phi_o/2$ and a second auxiliary signal constituted by a periodic linear ramp ($\phi_R$) of a frequency $f_R$ well below $F_I$ and of amplitude $\phi_1$, the transducer thus receiving a composite signal constituted by the signal to be measured, the first auxiliary signal and the second auxiliary signal;

deducing from the signal supplied by the transducer, two periodic signal $V_{C1}$ and $V_{C2}$, of period $\phi_o$; and in quadrature;

measuring the level b of the second auxiliary signal when the signal $V_{C1}$ reaches a predetermined state, said state having a periodicity $\phi_1$ in the signal of $V_{C1}$;

counting the number a of periods $\phi_1$ by which the signal to be measured varies as a function of the changes of state of the signals $V_{C1}$ and $V_{C2}$, the level of said second auxiliary signal being blocked during said count;

calculating the variation $\Delta\phi_x$ of the signal to be measured in accordance with the equation:

$$\Delta\phi_x = a\phi_1 + b, \quad 0 \leq b \leq \phi_1.$$

Application more particularly to Josephson effect magnetic transducers.

11 Claims, 4 Drawing Sheets

PROCESS FOR THE DIGITIZATION AND LINEARIZATION OF A TRANSDUCER WITH A QUASI-SINUSOIDAL PERIODIC CHARACTERISTIC AND CORRESPONDING APPARATUS

DESCRIPTION

The present invention relates to a process for the digitization and linearization of a transducer with a quasisinusoidal periodic characteristic. It also relates to an apparatus for performing this process.

The invention is more particularly used in magnetometry, for magnetic flux measurements using a Josephson effect transducer, as well as in optical interferometry for measuring an optical path by means of a Mach-Zehnder fibre interferometer. In general terms, the invention is applicable to the measurement of any physical magnitude by means of a transducer having a quasi-sinusoidal periodic characteristic. For illustration purposes only, the invention will be described in its application to a Josephson effect magnetic flux transducer.

This Josephson effect magnetic flux transducer, also called a SQUID transducer (for superconducting quantum interference device) is used for the direct measurement of a magnetic field, e.g. in biomagnetism or geomagnetism. It can also be indirectly used for measuring voltages or currents. The voltage or current to be measured is in general applied to an inductance coupled to the SQUID transducer, which leads to a flux therethrough. Another indirect application is the measurement of temperatures by the evaluation of the thermal noise appearing at the terminals of a resistor.

It is known that there are two separate groups of SQUID transducers, namely the radiofrequency transducer and the continuous transducer. A complete analysis of their operation is e.g. provided in the article by J. Clarke in the journal "NATO Advanced Study Institutes Series", series B. Physics, vol. 2.1, 1977, pp. 67–124.

The radiofrequency SQUID transducer is constituted by a superconducting ring interrupted by a single Josephson junction kept at a very low temperature, usually in a liquid helium bath. An oscillating circuit, whose coil is magnetically coupled to the SQUID transducer, is excited about its resonant frequency, i.e. in general at a frequency between a few dozen and a few hundred megahertz. Under these conditions, the radiofrequency impedance of the oscillating circuit varies periodically with the magnetic flux applied to the ring and said period is equal to a magnetic flux quantum $\phi_o = 2 \cdot 10^{-15}$ Wb ($\phi_o = h/2e$, h being the Planck constant and e the charge of the electron). The impedance variations are detected by an associated electronic chain which, at the output, supplies a periodic voltage of period $\phi_o$, as a function of the magnetic flux to be measured.

The other type of SQUID transducer is the continuous SQUID transducer. It comprises a superconducting loop interrupted at two locations by identical Josephson junctions. In the absence of a magnetic flux applied to the ring, if the SQUID transducer is supplied by an electric current $I_a$, the electric voltage V at the terminals of the ring is zero up to a current $I_a$ equal to twice the critical current $I_c$ of the junctions. As from a current $I_a$ equal to $2 \cdot I_c$, the characteristic $V(I_a)$ tends towards an ohmic characteristic.

The application of a magnetic flux to the ring leads to the flow of an electric current in said ring, which unbalances the current passing through the two junctions and consequently causes a passage to a non-zero voltage as from a current $I_a$ equal to $2 \cdot I_c - \Delta I_m$. As a result of the quantification of the magnetic flux in the superconducting ring, $\Delta I_m$ is a periodic function of the magnetic flux in the ring of period equal to $\phi_o$. If the SQUID transducer is polarized under a constant electric current close to $2 \cdot I_c$, the voltage developed at the terminals of the SQUID transducer is consequently a periodic function of period $\phi_o$ of the magnetic flux applied.

In order to better exploit the signal-to-noise ratio of the signals supplied by SQUID transducers, it is known to modulate the magnetic flux to be measured. This modulation is carried out by creating with a coil directly coupled to the transducer ring, a sinusoidal magnetic flux of frequency $f_I$ higher than the highest frequency of the range of the magnetic field to be measured (up to a few hundred kilohertz) and of peak-to-peak amplitude of approximately $\phi_o/2$. After passing into a mixer, whose local signal is at the frequency $f_I$, or into an inverter demodulator synchronized with the modulation and then after filtering the output voltage $V_d$ of the SQUID transducer is still a periodic function of the magnetic flux $\phi_x$ to be measured and it is also of a zero mean value. The variation $V_d(\phi)$ is also usually close to a sinusoidal law.

The interest of this process is that it makes it possible to amplify at intermediate frequency the signal from the SQUID transducer and to eliminate its mean value without adding very low frequency noise. In the case of a transducer having a stronger signal, it is possible to directly use said signal without the process described hereinbefore.

In known magnetometers the linearization of the output voltage variations as a function of the input magnetic flux variations is brought about by a flux feedback method. The voltage $V_d$ is amplified and filtered and the output voltage $V_s$ obtained in this way makes it possible to inject via a resistor R a current which, as a result of a coil coupled to the SQUID transducer, makes it possible to produce a magnetic feedback flux $\phi_{CR}$. This feedback has the effect of ensuring a linear response, whilst maintaining the error flux $\phi_x - \phi_{CR}$ sufficiently small compared with $\phi_o/2$. In practice, the error signal is minimized for a given input flux by increasing the open loop gain $A_o$.

As is conventionally the case in looped systems, the open loop gain must be reduced to unity for a frequency somewhat below the frequency for which the phase displacements in the loop would introduce a phase rotation of $\pi$, i.e. an unstable positive reaction. This is generally brought about by introducing an integrator into the amplifier stage.

Under these conditions, the operating equations of the looped system in the absence of background noise are as follows:

$$V_d = \frac{1}{A_o} \frac{dV_s}{dt} \, ; \, \epsilon = \phi_x - V_s \cdot \frac{M}{R} \, ; \, \phi_{CR} = V_s \cdot \frac{M}{R}$$

in which M is the mutual inductance of the transducer.

The total flux $\epsilon$ in the SQUID transducer, equal to $\phi - \phi_{CR}$, is linked with the voltage $V_d$ supplied by the transducer by the aforementioned sinusoidal relation: $V_d = V_d(\epsilon)$, said equations leading to:

$$\frac{d\epsilon}{dt} = \frac{d\phi}{dt} - \frac{MA_o}{R} V_d(\epsilon).$$

However, the voltage $V_d(\epsilon)$ is periodic and limited to $\pm V_{dm}$. Thus, on applying to the looped system a flux ramp of slope $$\frac{d\phi}{|dt|} > \frac{MA_o}{R} V_{dm}$$

there can be no solution $d\epsilon/dt=0$. In this case, the error signal will evolve in the time until it brings the operating point of $V_d(\epsilon)$ to a negative and therefore unstable slope zone, the output voltage then undergoing an irreversible change. These unlooping phenomena are accompanied by "flux jumps" in the SQUID transducer, which are analogous to the unlocking operations of phase-locked loops. The presence of the background noise, which helps to add random fluctuations to the error signal, then decreases further the maximum admissible input flux variation speed. A detailed study is provided e.g. in the article by D. Brunet-Brunol et al, published in "Journal of Applied Physics", no. 50, pp. 521–529, 1979. In the same way, the looped system is very sensitive to pulse-type interference.

The object of the present invention is to obviate these disadvantages by avoiding the use of a feedback loop. It also aims at digitizing and linerizing the signal supplied by the SQUID transducer, or in general terms the response of any transducer with a quasi-sinusoidal periodic characteristic, which e.g. makes is possible to simplify the subsequent processing of said signal.

More specifically, the invention relates to a process for the digitization and linerization of a transducer with a quasi-sinusoidal periodic characteristic of peirod $\phi_o$ for measuring a variation $\Delta\phi_x$ of a signal $\phi_x$ received by said transducer and which comprises:

superimposing on said signal to be measured $\phi_x$, a first periodic auxiliary signal $\phi_I$ of frequency $f_I$ above the highest frequency of the range of the signal to be measured $\phi_x$, and of amplitude substantially equal to $\phi_o/2$ and a second periodic auxiliary signal $\phi_R$ constituted by a linear ramp of frequency $f_R$ well below $f_I$ and of amplitude $\phi_1$, said transducer thus receiving a composite signal constituted by the signal to be measured, the first auxiliary signal and the second auxiliary signal;

deducing from the signal $V_S$ supplied by the transducer, two signals $V_{C1}$ and $V_{C2}$ in quadrature and of the same period $\phi_o$;

measuring the level b of the second auxiliary signal when the signal $V_{C1}$ reaches a predetermined state, said state having a periodicity $\phi_1$ in the signal $V_{C1}$;

counting the number a of periods $\phi_1$, by which the signal to be measured varies as a fucntion of the changes of state of the signals $V_{C1}$ and $V_{C2}$, the level of the second auxiliary signal being blocked during said count;

calculating the variation $\Delta\phi_x$ of the signal to be measured in accordance with the equation:

$\Delta\phi_x = a\phi_1 + b$, in which $0 \leq b \leq \phi_1$.

Thus, the process according to the invention makes it possible to obtain a signal representing the variation of the signal to be measured, which is linearly expressed as a function of the term $\phi_1$.

According to a first preferred embodiment, the signal $V_{C1}$ is a square-wave signal and the level b of the second auxiliary signal is measured on each front of the signal $V_{C1}$, the periodicity $\phi_1$ of said state being equal to $\phi_o/2$.

According to a first variant, in which the signals $V_{C1}$ and $V_{C2}$ are square, the number a of half-period $\phi_o/2$ is counted as a function of the transitions of signals $V_{C1}$ and $V_{C2}$.

According to a second variant, in order to count the number a of half-period $\phi_o/2$, the following procedure is adopted:

the level $b_i$ of the second auxiliary signal on each front of the signal $V_{C1}$ is stored, the state $E_i$ of the signal $V_{C2}$ is simultaneously stored, state $E_i$ of signal $V_{C2}$ is compared with its preceding state $E_{i-1}$ and in the following manner the number a is modified if said states $E_{i-1}$ and $E_i$ are different:

(a) a is incremented if the final stored level $b_i$ is larger than the preceding level $b_{i-1}$, (b) a is decremented if the final stored level $b_i$ is smaller then the preceding level $b_{i-1}$.

According to a second preferred embodiment, the signal $V_{C1}$ is a square-wave signal and the level b of the second auxiliary signal is measured on a front of given direction of said signal $V_{C1}$, the periodicity of the measurement of the level of said second auxiliary signal then being equal to $\phi_o$.

According to a first variant, the signal $V_{C2}$ is also a square-wave signal and the number a is incremented when the signal $V_{C1}$ has a rising front, when the signal $V_{C2}$ is at a high level, said number a being decremented when the signal $V_{C1}$ has a falling front, when the signal $V_{C2}$ is at the high level and said number a is not modified when the signal $V_{C2}$ is at the low level.

According to a second variant, the number a is modified as a function of the measured level $b_i$ and the preceding level $b_{i-1}$ measured in the following way:

if $b_i - b_{i-1} > \phi_o/2$, a is incremented if $|b_i - b_{i-1}| < \phi_o/2$, a is not modified if $b_i - b_{i-1} < -\phi_o/2$, a is decremented.

The invention also relates to an apparatus for performing this process.

The features and advantages of the invention can be better gathered from the following description given in illustrative and non-limitative manner with reference to the attached drawings, wherein show:

FIG. 1 A graph showing the characteristic of a transducer having a quasi-sinusoidal periodic characteristic to which the invention applies.

Figure 2:
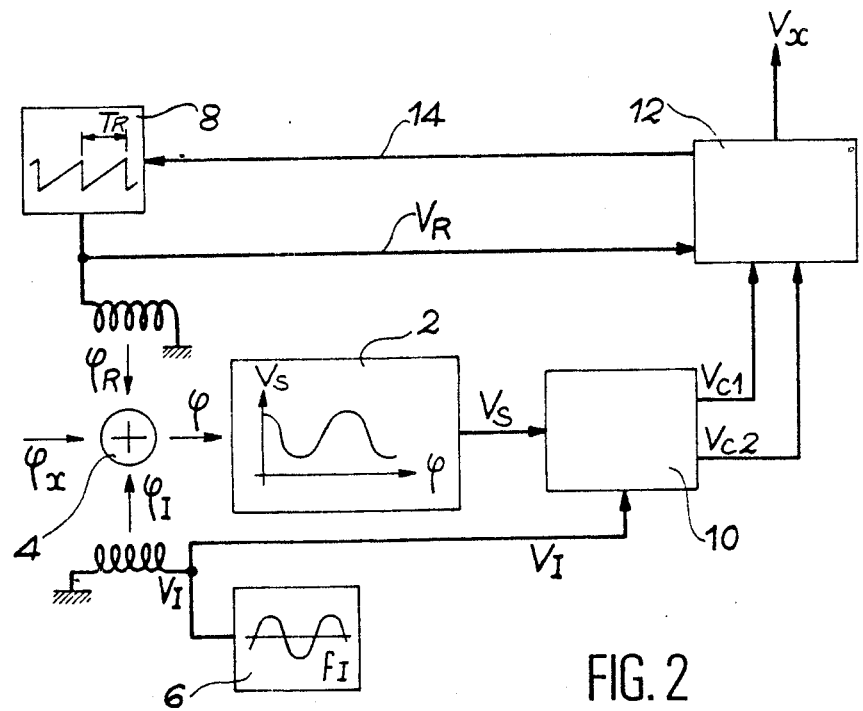

FIG. 2 Diagrammatically an apparatus for performing the inventive process.

Figure 3:
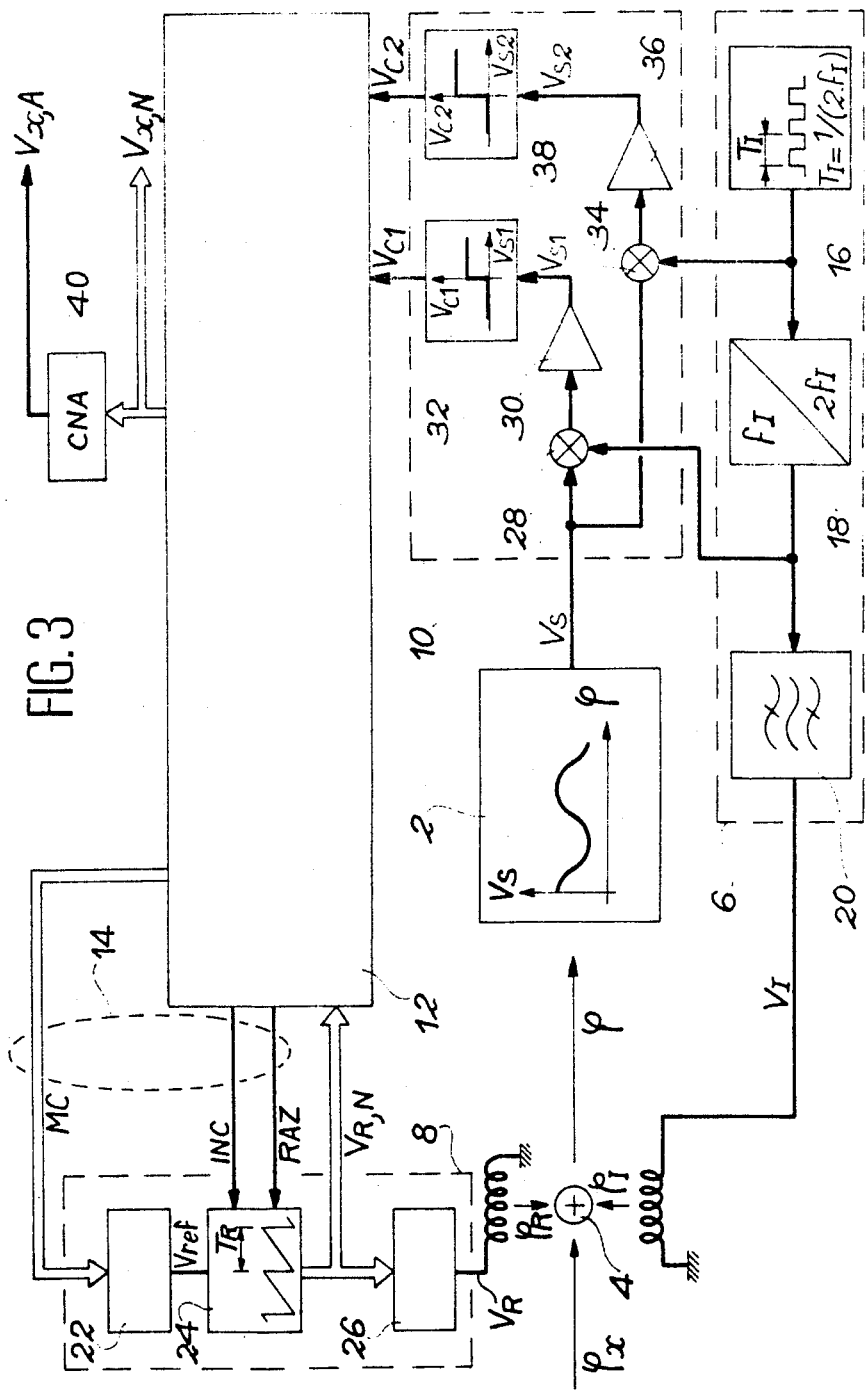

FIG. 3 An embodiment of an apparatus for performing the inventive process, in the case of a Josephson effect magnetic flux transducer.

Figure 4:
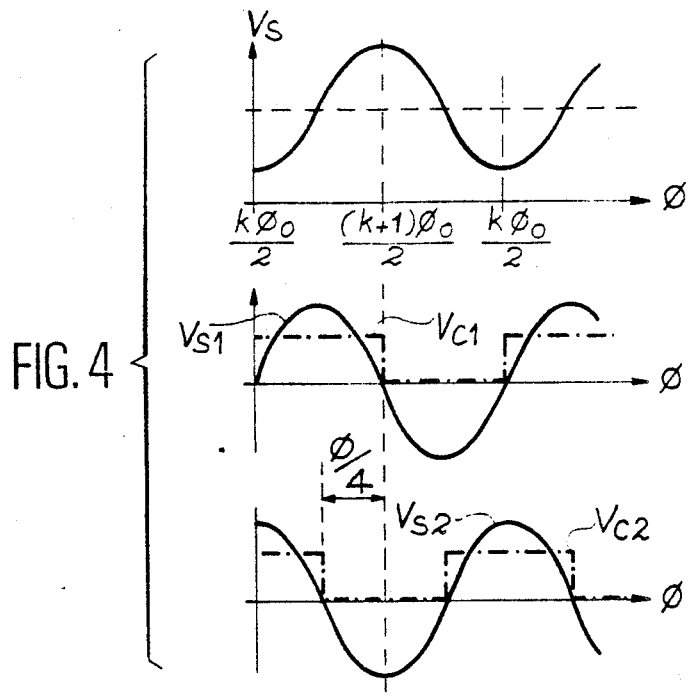

FIG. 4 Diagrammatically the configuration of the signals appearing in the apparatus of FIG. 3.

Figure 5:
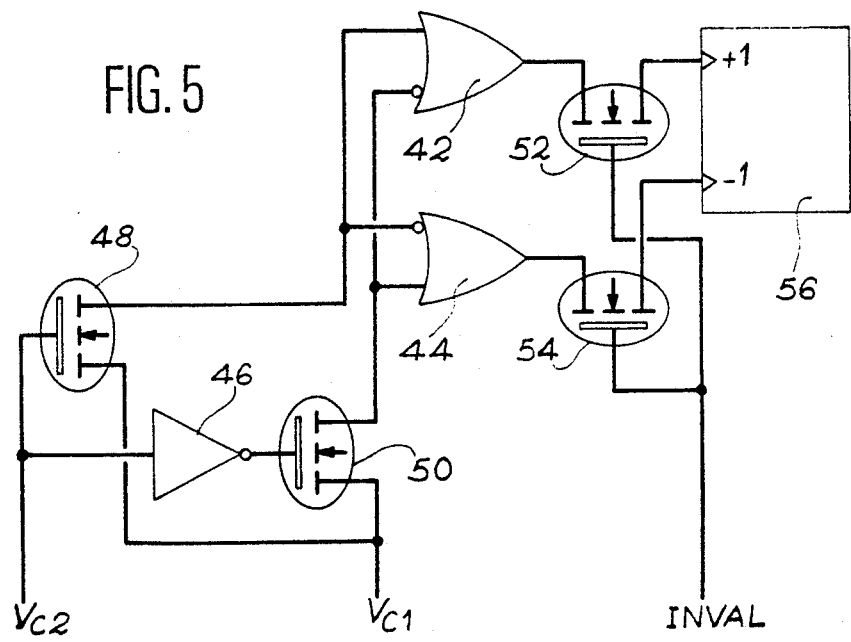

FIG. 5 An embodiment of the apparatus making it possible to increment or decrement a bidirectional counter, whose content represents the number a.

Figure 6:
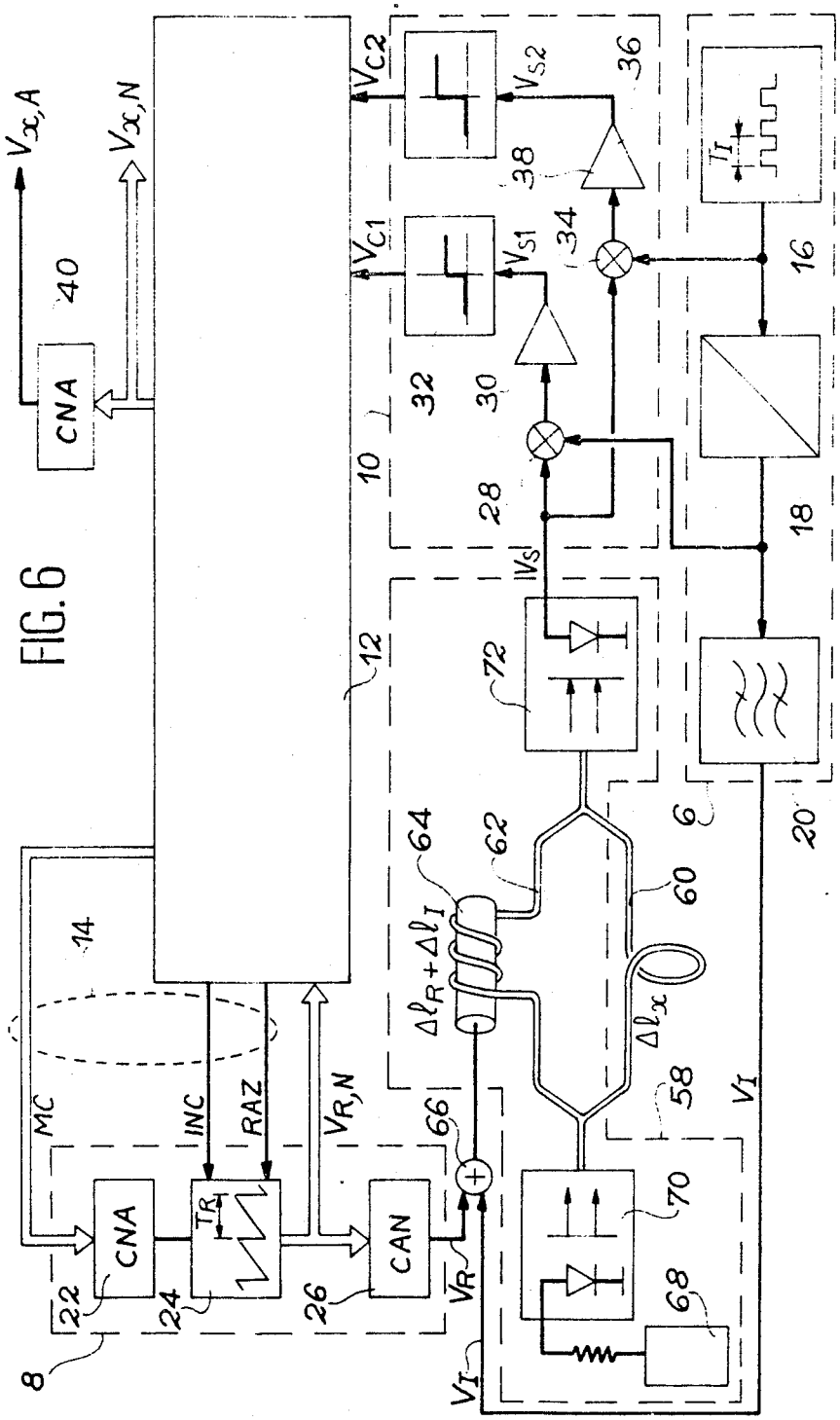

FIG. 6 An embodiment of an apparatus for performing the invention in its application to optical interferometry.

The invention relates to the digitization and linearization of the signal supplied by a transducer with a quasi-sinusoidal periodic characteristic. FIG. 1 is a graph showing the characteristic of such a transducer. The signal $V_S$ supplied by said transducer, which is in general an electric voltage signal, is a periodic function of the signal received by the transducer. In the case of a Josephson effect magnetic flux transducer, said period $\phi$ is equal to $h/2e$, in which h is the Planck constant and e the charge of an electron.

The characteristic shown in FIG. 1 reveals that the relation between a variation of the signal received by the transducer and the corresponding variation of the signal supplied by the transducer is not linear. The aim of the invention is to linearize this function in order to permit an easier exploitation of the signal supplied by the transducer.

FIG. 2 diagrammatically shows an apparatus for performing the inventive process. For example, the apparatus shown is a magnetometer, whereof the transducer is of the Josephson effect magnetic flux transducer type.

This apparatus consequently comprises a transducer 2 receiving a magnetic flux $\phi$ and supplying a voltage signal $V_S$ corresponding to said magnetic flux. The magnetic flux $\phi$ received by transducer 2 results from the superimposing, indicated symbolically by an adder 4, of a magnetic flux $\phi_x$, whereof it is wished to measure the variations, a periodic magnetic flux $\phi_I$ of frequency $f_I$ and a periodic magnetic flux $\phi_R$ of period $T_R$.

Flux $\phi_I$ is used for modulating the magnetic flux $\phi_x$, whose variations are to be measured. This magnetic flux is produced by a coil receiving a sinusoidal current supplied by a generator 6. In the same way, the magnetic flux $\phi_R$ is produced by a coil receiving a sawtooth current supplied by a generator 8.

The apparatus also comprises a demodulation means 10 for producing, on the basis of the signal $V_S$ supplied by transducer 2, two signals $V_{C1}$ and $V_{C2}$, having the same period $\phi_o$ as signal $V_S$ and being in quadrature. In order to produce the two signals $V_{C1}$ and $V_{C2}$, means 10 receives the signal $V_S$ supplied by transducer 2 and at least the signal $V_I$ supplied by generator 6.

Finally, the apparatus comprises a processing means 12 receiving the signals $V_{C1}$ and $V_{C2}$ supplied by the demodulation means 10 and the signal $V_R$ supplied by generator 8. As a function of these three signals, the processing means 12 supplies a signal $V_{x,N}$, which represents a variation of the magnetic flux $\phi_x$, the signal $V_{x,N}$ varying linearly with the magnetic flux $\phi_x$.

The signal $V_{x,N}$ produced by the the processing means 12 can be obtained by combining in various ways the signal $V_R$ supplied by the generator 8 and the signals $V_{C1}$ and $V_{C2}$ supplied by the demodulation means 10. Examples of the processing process will be given hereinafter. In each of these processes, it is necessary for the processing means 12 to be able to stop the generator 8 or reset the signal supplied by said generator. For this purpose, there is a control line 14 between processing means 12 and generator 8.

FIG. 3 shows an embodiment of an apparatus for the digitization and linearization of a Josephson effect magnetic flux transducer. The two auxiliary magnetic fluxes $\phi_I$ and $\phi_R$ are in each case applied to the transducer 2 via a coil, which receives currents proportional to said fluxes, said coils coinciding with the radiofrequency coil in the case of a radiofrequency SQUID transducer.

In the represented embodiment, generator 6, which supplies a voltage signal $V_I$ making it possible to produce the auxiliary magnetic flux $\phi_I$ comprises a generator 16 of a periodic square-wave signal of frequency $2 \cdot f_I$, a divider by two 18 and a selective filter 20 centred on frequency $f_I$, which makes it possible to convert the square-wave signal received into a substantially sinusoidal signal.

In the same way, generator 8 incorporates a digital-analog converter 22 receiving from the processing means 12 a control word MC and supplying a reference voltage $V_{ref}$, a ramp counter 24 having a ramp amplitude control input to which is applied the signal $V_{ref}$, an incrementation control input INC, said ramp counter supplying a sawtooth digital signal $V_{R,N}$ of period $T_R$ and a resetting control input RAZ, as well as a digital-analog converter 26 receiving the signal supplied by counter 24, the voltage $V_{ref}$ and therefore the control word MC, for the maximum content of counter 24 to correspond to a desired amplitude sawtooth. The control word MC is then regulated by the processing means 12 to the calculated value, which ends the calibration process and makes the apparatus ready for use.

The graph of FIG. 4 shows the characteristic of the transducer 2 and correspondingly the signal $V_{S1}$ supplied by amplifier 30, signal $V_{C1}$ supplied by comparator 32, signal $V_{S2}$ supplied by amplifier 36 and signal $V_{C2}$ supplied by comparator 38.

The signals $V_{C1}$ and $V_{C2}$ supplied by the demodulation means 10 are used by the processing means 12 in combination with the signal $V_{R,N}$ supplied by counter 24 in order to produce the signal $V_{x,N}$ representative of the variations of the magnetic flux $\phi_x$. This processing means carries out sequencing, calculating, control and calibration operations. It can advantageously comprise a microprocessor, the associated memories and optionally logic circuits in order to carry out certain operations on signals $V_{C1}$, $V_{C2}$ and $V_{R,N}$.

The digitization and linearization process realized by the processing means 12 consists of producing a signal $V_{x,N}$, representative of a variation $\Delta\phi_x$ of a magnetic flux $\phi_x$ as a linear function of the flux quantum $\phi_o$. More specifically, the processing means 12 calculates coefficients a and b such that:

$$V_{x,N} = a \cdot \phi_1 + b,$$

in which $\phi_1$ represents a period or a half-period of the magnetic flux quantum $\phi_o$.

According to a first embodiment of the inventive process, the processing means counts the number a of half-periods $\phi_O/2$ as from the signals $V_{C1}$ and $V_{C2}$.

The process for calculating the coefficients a and b is as follows. Following a resetting of generator 24 by line RAZ, the processing means 12 brings about a linear increase in the signal supplied by the generator 24 by periodically supplying analog signal obtained being used for producing the second auxiliary magnetic flux $\phi_R$.

The demodulation means 10 comprises two assemblies in parallel, for respectively producing a first signal $V_{S1}$ and a second signal $V_{S2}$ from the signal $V_S$ supplied by transducer 2. The two signals $V_{S1}$ and $V_{S2}$ produced are periodic and in quadrature. In series, the first assembly comprises a modulator 28, an amplifier 30 and a threshold comparator 32. Modulator 28 receives the signal $V_S$ supplied by transducer 2 and the square signal, of frequency $f_I$, supplied by the divider 18 of generator 6. After amplification in amplifier 30, the signal $V_{S1}$ supplied by modulator 28 is converted into a two level signal $V_{C1}$ by threshold comparator 32.

In the same way, the second assembly of the demodulation means 10 comprises a modulator 34 receiving the signal $V_S$ supplied by the transducer 2 and a square-wave signal of frequency $2 \cdot f_I$ supplied by generator 16 of generator 6, an amplifier 36 and a threshold comparator 38, which supplies a two level signal $V_{C2}$.

The calibration of the ramp supplied by counter 24 is carried out with the aid of signal $V_{S1}$ in the following way. A high amplitude control word MC is supplied to the digital-analog converter 22, which checks the reference of counter 24, in such a way that the ramp can reach an adequate amplitude to enable the voltage $V_{S1}$ to pass through three successive zeros. The content of counter 24 is read at the passage of the first and third zeros of $V_{S1}$ and the difference is calculated by the processing means 12. This difference corresponds to an excursion of a quantum $\phi_o$, but suffers from uncertainty as a result of background noise phenomena. In order to limit this uncertainty, a large number of successive measurements are performed in order to calculate a mean value, which is sufficiently close to the real value. This mean value makes it possible to deduce, by a calculation performed by the processing means 12, the theoretical value which must be assumed by the an incrementation signal INC to said generator. This produces a magnetic flux $\phi_R$, which increases linearly and which is superimposed on the flux $\phi_x$, whereof it is wished to measure the variations. Signals $V_{S1}$ and $V_{S2}$ supplied by amplifiers 30 and 36 vary sinusoidally as a function of the sum $\phi_a$ of the magnetic fluxes $\phi_x$ and $\phi_R$.

As soon as one of these two signals (e.g. $V_{S1}$) passes through zero, incrementation of the signal supplied by generator 24 is stopped. If $\phi_R$ is used for designating the amplitude reached by the magnetic flux $\phi_R$ at this time, we obtain $$\phi_a = \phi_x + \phi_R = k \cdot \phi_o / 2$$

which can be written in the form:

$$\phi_x = (k-1)\phi_o/2 + (\phi_o/2 - \phi_R).$$

Thus, coefficient b is simply obtained by reading the signal supplied by generator 24, when signal $V_{S1}$ e.g. passes through zero.

The numerical expression of any variation in the magnetic flux $\phi_x$ can then be determined by evaluating the factor k, provided that the magnetic flux $\phi_x$ undergoes no significant variation during the growth time of the magnetic flux $\phi_R$. In order to satisfy this condition, it is merely necessary to choose for the period $T_R$ of the signal supplied by generator 24 a sufficiently small value. The evolution of the factor k is then followed independently of the interpolation (i.e. calculation of the coefficient b) by a half-quantum $\phi_o/2$ bidirectional counter controlled by signals $V_{C1}$ and $V_{C2}$. During this forward and reverse count, generator 24 is not incremented. The signal $\phi_R$ supplied is constant and equal to the value which it had when signal $V_{S1}$ is passed through zero.

An embodiment of a circuit for the determination of factor k is shown in FIG. 5. This circuit comprises two OR gates 42, 44 an inverter 46, four switches 48, 50, 52 and 54 constituted by MOS transistors and a bidirectional counter 56. Each of the two OR gates 42, 44 have a non-inverting input and an inverting input.

The signal $V_{C1}$ is applied to the non-inverting input of the OR gate 42 and to the inverting input of the OR gate 44 across the switch 48 controlled by signal $V_{C2}$. Signal $V_{C1}$ is also applied to the inverting input of OR gate 42 and to the non-inverting input of OR gate 44 across switch 50 controlled by the signal $V_{C2}$ inverted by inverter 46.

The output of OR gate 42 is connected to the incrementation input of the bidirectional counter 56 across switch 52. In the same way, the output of OR gate 44 is connected to the decrementation input of the bidirectional counter 56 across switch 54. Switches 52 and 54 are kept in the open state by an invalidation signal INVAL whilst generator 24 is not blocked (i.e. whilst signal $V_{S1}$ is not passed through zero).

The circuit shown in FIG. 5 functions in the following way. When signal $V_{C2}$ is at high level, switch 48 is closed and switch 50 open. The rising front of signal $V_{C1}$ then produces the incrementation of counter 56 and the falling front of said same signal $V_{C1}$ produces the decrementation of counter 56. Conversely, if signal $V_{C2}$ is at low level, switch 48 is open and switch 50 closed. Counter 56 is then incremented on the falling front of signal $V_{C1}$ and decremented on the rising front thereof. Thus, counter 56 stores the coefficient a.

The processing means 12 of the apparatus shown in FIG. 3 then supplies a digital signal $V_{x,N}$ defined by:

$$V_{x,N} = a\phi_o/2 + b$$

This signal can also be applied to the input of a digital-analog converter 40 for supplying a corresponding signal $V_{x,A}$.

Another method having the advantage of synchronizing the calculation of coefficients a and b can be realized by processing means 12. The calculating method for coefficient b is identical to the aforementioned method, but the storage of the valve of signal $V_{R,N}$ supplied by generator 24 when the signal $V_{C1}$ (for example) passes through the zero value is completed by the storage of the state of signal $V_{C2}$ by means of a zero flag or mark. This is repeated for each ramp supplied by generator 24. If for two successive ramps the zero flag does not change, coefficient a is not modified. However, if a change of state of the zero flag is observed, the last value of the stored coefficient b is compared with the stored value for the preceding ramp. If the final value exceeds the preceding value, coefficient a is incremented, whilst in the reverse case coefficient a is decremented.

It should be noted that this method can no longer be used as soon as the variation of the magnetic flux $\phi_x$ exceeds a half-quantum $\phi_o/2$ between two calculating instants of coefficient b.

The two methods described hereinbefore are based on the detection of the passage through zero of signal $V_{C1}$. In practice, said passage through zero may not have a periodicity equal to $\phi_o/2$. This is particularly the case if signal $V_{S1}$ has a shift voltage, because then the positive alternations and the negative alternations of signal $V_{S1}$ will no longer have the same length.

This can be obviated by blocking the generator 24 on an event having a more precise periodicity. This event can e.g. be a rising or falling front of signal $V_{C1}$, whose period is strictly equal to $\phi_o$.

The method for calculating coefficients a and b can be identical to the two methods already described, with the sole difference that the amplitude of the sawtooth signal supplied by the generator 24 is equal to $\phi_o$ instead of $\phi_o/2$. This value is simply adjusted by means of the control word MC supplied by processing means 12 to analog-digital converter 22. The signal $V_{x,N}$ supplied by the processing means 12 is then defined by:

$$V_{x,N} = a\phi_o + b.$$

Another possible variant consists of comparing the coefficients $b_i$ and $b_{i+1}$ corresponding to the amplitudes of two successive ramps and then modifying the value of the coefficient a in the following manner:

if $b_{i+1} - b_i < -\phi_o/2$, a is decremented,
if $|b_{i+1} - b_i| < \phi_o/2$, a is unchanged,
if $b_{i+1} - b_i > \phi_o/2$, a is incremented.

The invention has been described with reference to FIGS. 2 to 5 in its application to a Josephson effect magnetic flux transducer. However, the invention is not limited to said application and in fact it can be used for the digitization and linearization of any transducer having a quasi-sinusoidal periodic characteristic. For example, FIG. 6 shows an apparatus for realizing the invention in the case of a transducer of the Mach-Zehnder fibre interferometer type.

In the apparatus shown in FIG. 6, the elements identical to those of the apparatus of FIG. 3 carry the same references. Thus, the only differences are in the nature of the transducer and in the conversion of the auxiliary signals $V_R$ and $V_I$ into an optical path length variation instead of into a magnetic flux.

More specifically, transducer 58 is an interferometer incorporating an optical fibre 60 defining an optical path, whereof it is wished to measure a length variation $\Delta l_x$ and a second optical fibre defining a reference path, said second optical fibre 62 being in part wound around a piezoelectric cylinder 64 which permits, by controlling the application of a voltage to said cylinder, the variation of the reference optical path length. In the envisaged application, the piezoelectric cylinder 64 receives the sum of the voltages $V_R$ and $V_I$ supplied by generators 8 and 6 from an adder 66.

The light beams emitted in the two fibres 60, 62 are produced by a laser diode 70 supplied by an electric supply circuit 68. At the transducer output, a photodetector 72 receives the two superimposed light beams and supplies a corresponding voltage signal $V_S$.

The calculation of a variation $\Delta l_x$ in the length of the optical measuring fibre 60 is determined by the processing means 12 by combining the signal $V_{R,N}$ supplied by the ramp generator 24 and the signals $V_{C1}$ and $V_{C2}$ supplied by the demodulation means 10, in the same way as in the apparatus according to FIG. 3.

We claim:

1. A process for digitization and linearization of a transducer having a quasi-sinusoidal periodic characteristic of period $\phi_o$ for measuring a variation $\Delta\phi_x$ of a signal $\phi_x$ received by said transducer consisting in:
    achieving a first signal $V_I$ and second signal $\phi_I$ from said first signal, said second signal $\phi_I$ being a periodic signal of frequency $F_I$ above the highest frequency of the signal $\phi_x$ to be measured and of amplitude substantially equal to $\phi_2/2$,
    achieving a third periodic auxiliary signal $\phi_R$ constituted by linear ramp of frequency $f_R$ well below $F_I$ and of amplitude $\phi_1$,
    achieving a fourth signal be superimposing on the signal to be measured $\phi_x$ the second signal $\phi_I$ and thrid signal $\phi_R$,
    applying said fourth sihgnal $\phi$ to the transducer to achieve a fifth signal $V_S$,
    applying said fifth signal $V_S$ and said second signal $V_I$ to a modulating means to acheive a sixth and a seventh periodic signals $V_{C1}$ and $V_{C2}$ of same period and being in quadrature,
    measuring a level b of the third signal $\phi_R$ when one of the two signals in quadrature $V_{C1}$ reaches a predetermined state, said state having a periodicity $\phi_1$,
    counting a number a of periods $\phi_1$, by which said signal to be measured varies as a function of the changes of the state of the signals in quadrature $V_{C1}$ and $V_{C2}$, the level of the third signal $\phi_R$ being blocked during said count,
    determining the variation $\Delta\phi_x$ of said signal to be measured by the following relation:

$$\Delta\phi_x = a\phi_1 + b$$

in which $0 \leq b \leq \phi_1$,
    delivering a signal $V_x$ corresponding to said variation $\Delta\phi_x$.

2. Process according to claim 21, wherein one of the signals in quadrature $V_{C1}$ is a square-wave signal and in that the level b of said third signal $\phi_R$ is measured on each front of said signal $V_{C1}$, the periodicity $\phi_1$ of said measurement being equal to $\phi_o/2$.

3. Process according to claim 1, wherein the other signal in quadrature $V_{C2}$ is a square-wave signal and in that the number a of half-periods $\phi_o/2$ is counted as a function of the transitions of said signals in quadrature $V_{C1}$ and $V_{C2}$.

4. Process according to claim 1, wherein the counting of the number a of half-periods $\phi_o/2$, comprises the following steps:
    a level $b_i$ of the third signal $\phi_R$ is stored on each front of one of the signals in quadrature $V_{C1}$,
    a state $E_i$ of the other signal in quadrature $V_{C2}$ at this instant is stored,
    a state $E_i$ of said other signal $V_{C2}$ is compared with its preceding state $E_{i-1}$ and the number a is modified in the following way if said states $E_{i-1}$ and $E_i$ differ:
    (a) a is incremented if the last stored level $b_i$ is greater than the preceding level $b_{i-1}$,
    (b) a is decremented if the last stored level $b_i$ is smaller than the preceding level $b_{i-1}$.

5. Process according to claim 1, wherein one of the signals $v_{C1}$ in quadrature is a square-wave signal and in that the level b of said third signal $\phi_R$ is measured on a front of given direction of said signal in quadrature $V_{C1}$, the periodicity $\phi$ of said measurement being equal to $\phi_o$.

6. Process according to claim 1, wherein the other signal in quadrature $V_{C2}$ is also a squarewave signal and in that the number a is incremented when the sixth signal $V_{C1}$ has a rising front, the seventh signal $V_{C2}$ having a high level, said number a being decremented when the sixth signal $V_{C1}$ has a falling front when the seventh signal $V_{C2}$ is at a high level and the number a is not modified when seventh signal $V_{C2}$ is at the low level.

7. Process according to claim 1, wherein the number a is modified as a function of the measured level $b_i$ and the preceding level $b_{i-1}$ measured in the following way:

if $b_i - b_{i-1} > \phi_o 2$, a is incremented
if $|b_i - b_{i-1}| < \phi_o/2$, a is not modified
if $b_i - b_{i-1} < -\phi_o/2$, a is decremented.

8. Apparatus for the digitization and linearization of the response of a quasi-sinusoidal periodic characteristic transducer of period $\phi_o$ for measuring a variation $(\Delta\phi_x)$ of a signal to be measured ($\phi_x$) received by said transducer, said apparatus comprising:

- a first generator of a periodic auxiliary electric signal $V_I$ of frequency $f_I$ higher than the highest frequency of the range of the signal to be measured, said electric signal $V_I$ then being converted into a signal ($\phi_I$) detectable by the transducer and having an amplitude substantially equal to $\phi_o$,
- a second generator of an auxiliary electric signal $V_R$ constituted by a periodic linear ramp of frequency $f_R$ well below $f_I$, said electric signal $V_R$ then being converted into a signal ($\phi_R$) detectable by the transducer and having an amplitude $\phi_1$,
- a demodulation means for receiving the signal $V_S$ of period $\phi_o$ supplied by the transducer and at least the signal $V_I$ supplied by the generator 6 and for producing two signals $V_{C1}$, $V_{C2}$ in quadrature and of the same period $\phi_o$, and
- a processing means for combining the signals $V_{C1}$, $V_{C2}$ supplied by the demodulation means and the signal $V_R$ supplied by the generator, in order to calculate the coefficients a and b and produce a signal $v_x$ corresponding to the measured variation ($\Delta\phi_x$) of the signal to be measured in accordance with the equation:

$$V_x = a\cdot\phi_1 + b, \text{ in which } a \leq b \leq \phi_1.$$

9. Apparatus according to claim 8, wherein the generator comprises in series a generator of a square-wave signal of frequency $1/(2\cdot f_I)$, a divider by two and a selective filter supplying the signal $V_I$, said filter transforming the square-wave signal received into a quasi-sinusoidal signal.

10. Apparatus according to claim 8, wherein the demodulation means comprises two assemblies in parallel, each receiving the signal $V_S$ supplied by the transducer and respectively supplying the signals $V_{C1}$ and $V_{C2}$ in quadrature, one assembly comprising in series a modulator receiving the signal $V_S$ and the signal supplied by the divider, an amplifier and a threshold comparator, whilst the other assembly comprises in series a modulator receiving the signal $V_S$ and the signal supplied by the generator, an amplifier and a threshold comparator.

11. Apparatus according to claim 8, wherein the processing means measures the level b of the auxiliary signal $V_R$ when the signal $V_{C1}$ reaches a predetermined state, said state having a periodicity $\phi_1$ in signal $V_{C1}$, counts the number a of period $\phi_1$ by which the signal to be measured ($\phi_x$) varies as a function of changes of states of the signals $V_{C1}$ and $V_{C2}$, the level of said signal $V_R$ being blocked during said count, calculates the variation $\Delta\phi_x$ of the signal to be measured in accordance with the equation $$\Delta\phi_x = a\phi_1 + b, \ 0 \leq b \leq \phi_1$$

and supplies a signal $V_x$ representative of said variation $\Delta\phi_x$.

* * * * *